July 26, 1966 T. J. ROACH 3,262,234

METHOD OF FORMING A SEMICONDUCTOR RIM BY SANDBLASTING

Filed Oct. 4, 1963

INVENTOR.
THOMAS J. ROACH

BY

OSTROLENK, FABER, GERB & SOFFEN
ATTORNEYS

United States Patent Office 3,262,234

Patented July 26, 1966

3,262,234
METHOD OF FORMING A SEMICONDUCTOR RIM BY SANDBLASTING

Thomas J. Roach, Palos Verdes Estates, Calif., assignor to International Rectifier Corporation, Segundo, Calif., a corporation of California Filed Oct. 4, 1963, Ser. No. 313,856
3 Claims. (Cl. 51—320)

This invention relates to a novel method and structure for semiconductor wafers, and more particularly relates to the tapering of the edge of a wafer having a junction plane therein.

In the formation of semiconductor devices which have functions which must withstand high reverse voltages, a serious problem occurs in the creepage and tracking at the edge surface of the wafer.

The principle of the present invention is to taper the wafer edges so as to broaden the gap between the various layers of different conductivity materials within the wafer and thus, provide a longer surface which will be more resistant to creepage and tracking.

A novel method for achieving such tapering lies in the use of fine jets of sand or other suitable abrasives which are directed, at different angles, toward the wafer edge. One jet is positioned as to taper the wafer at a shallow angle, while the other tapers the wafer at the steeper angle. The wafer is rotated about its axis during this operation so that the sandblast can act on the full periphery of the wafer.

Accordingly, a primary object of this invention is to provide a novel method to increase creepage and tracking at the edge surface of a semiconductor wafer.

Another object of this invention is to provide a normal method to increase the voltage capability of power rectifiers or similar devices which have functions therein for resisting high inverse voltages.

A still further object of this invention is to provide a novel method for the tapering of the edge of a semiconductor wafer.

These and other objects of this invention will become apparent from the following description when taken in connection with the drawings, in which.

Figure 1:
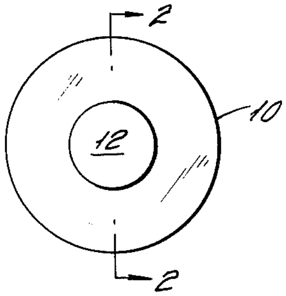
FIGURE 1 is a top view of a typical semiconductor wafer of the type to which the invention may be applied.
Figure 2:
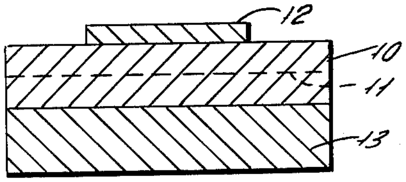
FIGURE 2 is a cross-sectional view of FIGURE 1 taken across the lines 2—2 in FIGURE 1.

Referring first to FIGURES 1 and 2, I have illustrated therein a typical semiconductor wafer 10 which has a junction plane 11 therein formed between two zones of opposite conductivity types. By way of example, the wafer 10 may be of monocrystalline silicon with the region above junction plane 11 being of the N-type conductivity, and the region below junction plane 11 being of the P-type conductivity. The wafer may, of course, be formed in any desired manner.

An upper electrode 12 is then secured to the top of wafer 10 in any desired manner, while a lower electrode 13 may be secured to the bottom of wafer 10 again in any desired manner.

The completed wafer shown in FIGURES 1 and 2 is of a type well known to the art, and could be fabricated by any standard technique and could have any typical dimension depending upon the application of the device. Moreover, further junctions may be included in the wafer depending upon the end application of the wafer.

By way of illustration where the wafer is to be used in a power rectifier, the wafer may have a thickness of the ordder of 10 mils and a diameter of the order of 500 mils. Clearly, the dimensions shown in FIGURES 1 and 2 have been greatly distorted for purposes of clarity.

Figure 3:
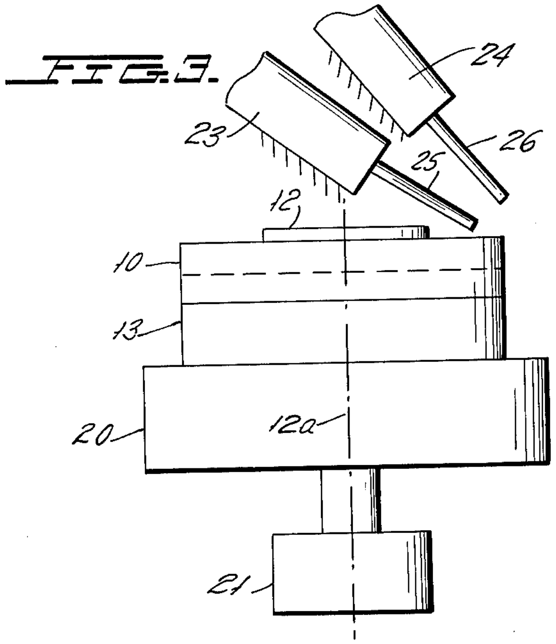
FIGURE 3 is a side plan view which illustrates the positioning of sandblast jets with respect to the wafer of FIGURES 1 and 2 which is mounted for rotation about its axis.

In accordance with the present invention, the completed wafer of FIGURES 1 and 2 is suitably secured to a rotatable pedestal 20, as shown in FIGURE 3, which, in turn, is connected to a suitable rotating means such as a motor 21. Thus, the pedestal 20 is rotatable about the axis **12*a*. The wafer is secured to pedestal 20 in any suitable manner as by gluing or any other desired manner of securing, and a first and second fine sand jet apparatus 23 and 24 which are fixed in position are suitably located with respect to the wafer 10 so that their fine jet nozzles 25 and 26 are adjacent to the upper edge of wafer 10**.

Figure 4:
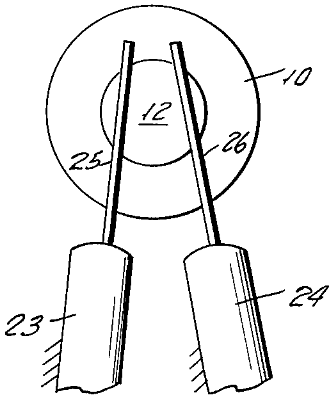
FIGURE 4 is a top view of the apparatus of FIGURE 3.

The nozzle 25 will deliver a fine sand jet at an angle, for example, of 10° with respect to the junction plane 11 of wafer 10, while the nozzle 26 will deliver a fine jet stream at an angle, for example, of 30° with respect to the junction plane 11 of wafer 10. As is best seen in FIGURE 4, the two nozzles are axially displaced with respect to one another.

A typical abrasive may be aluminum oxide particles having a diameter of 27 microns. The jet is a fine stream which is propelled through a 0.018" diameter nozzle at approximately 60 p.s.i. of air.

In operation, a fine sand jet emerges from nozzles 25 and 26 while the pedestal 20 and thus wafer 10 rotate about the axis 22.

Figure 5:
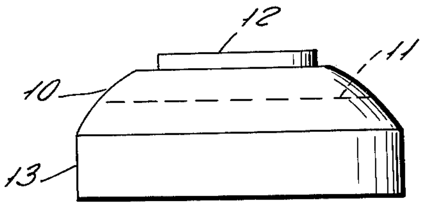
FIGURE 5 is a side plan view of the wafer of FIGURES 1 and 2 after the tapering operation is completed.

The action of the two sand jets will then taper the wafer until it reaches the shape shown in FIGURE 5. More specifically, the taper is preferably made to be less than 45° with respect to the junction plane 11 of wafer 10, and preferably falls within the range of 10° to 30°, although a greater taper angle still below 45° will perform satisfactorily.

Note that the creepage distance over the edge of the wafer has now been substantially increased, and the gap between the two layers forming junction plane 11 is increased. It is believed that this is the reason that the device has been found to have improved high voltage withstanding capabilities.

Although this invention has been described with respect to its preferred embodiments, it should be understood that many variations and modifications will now be obvious to those skilled in the art, and it is preferred therefore than the scope of the invention be limited not by the specific disclosure herein but only by the appended claims.

The embodiments of the invention in which an exclusive privilege or property is claimed are defined as follows:

1. The method of tapering an edge of a semiconductor wafer having an edge and a junction plane therein; said method comprising the steps of applying a first and second high speed jet of abrasive material toward the edge of said wafer and at angle thereto; said first and second jets of abrasive material forming angles of approximately 10° and 30° respectively to the junction plane of said wafer.

2. The method of claim 1 wherein said wafer is continuously rotated to bring new areas of the edge of said wafer into said jets.

3. The method of claim 1 wherein abrasion by said first and second high speed jets of abrasive material is continued until said edge is tapered to an angle of less than 45° with respect to the junction plane of the wafer.

(References on following page)

References Cited by the Examiner

UNITED STATES PATENTS

| | | | |
|---|---|---|---|
| 708,880 | 9/1902 | Heideger | 51—15 |
| 2,092,083 | 9/1937 | Ogle et al. | 51—15 X |
| 2,394,056 | 2/1946 | Hein | 51—319 X |
| 2,516,222 | 7/1950 | Lindmark | 51—320 |
| 2,858,653 | 11/1958 | Guptill | 51—320 |
| 3,100,276 | 8/1963 | Meyer | 317—234 |
| 3,179,860 | 4/1965 | Clark et al. | 317—234 |

LESTER M. SWINGLE, *Primary Examiner.*